(12) United States Patent
Arakawa

(10) Patent No.: US 7,483,288 B2
(45) Date of Patent: Jan. 27, 2009

(54) MEMORY DEVICE

(75) Inventor: Tomofumi Arakawa, Kanagawa (JP)

(73) Assignee: Sony Corporation (JP)

( * ) Notice: Subject to any disclaimer, the term of this patent is extended or adjusted under 35 U.S.C. 154(b) by 1934 days.

(21) Appl. No.: 10/060,226

(22) Filed: Feb. 1, 2002

(65) Prior Publication Data

US 2003/0002320 A1  Jan. 2, 2003

(30) Foreign Application Priority Data

Feb. 7, 2001   (JP)   ............................ P2001-031151

(51) Int. Cl.
 *G11C 11/24*   (2006.01)
(52) U.S. Cl. .................... 365/149; 365/230.03; 365/205
(58) Field of Classification Search ................. 365/149, 365/230.03, 205
 See application file for complete search history.

(56) References Cited

U.S. PATENT DOCUMENTS 5,594,681 A * 1/1997 Taguchi ....................... 365/149

2001/0026496 A1 * 10/2001 Hidaka ................... 365/230.03
2002/0003263 A1 * 1/2002 Tanizaki et al. ............. 257/368

\* cited by examiner

*Primary Examiner*—Huan Hoang
(74) *Attorney, Agent, or Firm*—Rader, Fishman & Grauer, PLLC; Ronald P. Kananen

(57) ABSTRACT

Disclosed is a memory device which can minimize a reduction in area efficiency even when the memory device has a small storage capacity and which can hide the access time to a row line. The memory device comprises: a matrix of a plurality of memory cells, each of which is connected to an intersection of each bit line of a plurality of pairs of bit lines and each word line of a plurality of word lines which intersect the bit lines; a plurality of sense amplifiers capable of read and write operations independently of one another, which are disconnectedly connected in parallel with the plurality of memory cells connected to the pairs of bit lines, through the pairs of bit lines; and a read gate and a write gate which are connected to each of the plurality of sense amplifiers connected in parallel with the pairs of bit lines, wherein the memory device is controlled so that read data is read out successively, when a word line to be activated, of the plurality of word lines is switched to another word line to be activated.

13 Claims, 8 Drawing Sheets

MEMORY DEVICE

BACKGROUND OF THE INVENTION

1. Field of the Invention

The present invention relates to a memory device.

2. Description of the Related Art

A D-RAM (dynamic random access memory) of the prior art will be described below with reference to FIG. 1 and FIG. 2 specifically showing some of circuits shown in FIG. 1. The D-RAM has plural, (n+1) pairs of bit lines BL0 and BLB0, BL1 and BLB1, . . . , and BLn and BLBn; plural, (m+1) word lines WL0, WL1, . . . , and WLm which intersect the bit lines BL0 and BLB0, BL1 and BLB1, . . . , and BLn and BLBn; a matrix of a plurality of D-RAM memory cells 10-0 {MC0-1, MC1-0, MC2-0, . . . , MC(m−1)-0, and MCm−0}, 10-1 {MC0-1, MC1-1, MC02-1, . . . , MC(m−1)-1, and MCm−1}, and 10-n{MC0-n, MC1-n, MC2-n, . . . , MC(m−1)-n, and MCm−n}, each of which is connected to an intersection of each bit line and each word line; and sense amplifiers 30-0, 30-1, . . . , and 30-n connected to the memory cells 10-0, 10-1, . . . , and 10-n, each of which comprises a plurality of memory cells, through the bit lines BL0 and BLB0, BL1 and BLB1, . . . , and BLn and BLBn, respectively.

Each of the memory cells 10-0 {MC0-0, MC1-0, MC2-0, . . . , MC(m−1)-0, and MCm−0}, 10-1 {MC0-1, MC1-1, MC2-1, . . . ,MC(m−1)-1, and MCm−1}, . . . , and 10-n {MC0-n, MC1-n, MC2-n, . . . , MC(m−1)-n, and MCm−n} comprises, for example, an N-channel (or P-channel) type MOS-FET Q which functions as a switching transistor, and a capacitor C connected in series with the MOS-FET Q.

The drains of the MOS-FETs Q of the memory cells MC0-0, MC2-0, MC4-0 , . . . of the memory cell 10-0, the memory cells MC0-1 , MC2-1, MC4-1 , . . . of the memory cell 10-1, . . . , and the memory cells MC0-n, MC2-n, MC4-n, . . . of the memory cell 10-n are connected to the bit lines BL0, BL1, BL2, . . . , and BLn, the gates thereof are connected to the word lines WL0, WL2, WL4, . . . , and the sources thereof are connected to cell plate potential lines VL to which a common cell plate potential Vcp is applied, through the capacitors C.

The drains of the MOS-FETs Q of the memory cells MC1-0 , MC3-0 , MC5-0 , . . . of the memory cell 10-0, the memory cells MC1-1 , MC3-1, MC5-1, . . . of the memory cell 10-1, . . . , and the memory cells MC1-n, MC3-n, MC5-n, . . . of the memory cell 10-n are connected to the bit lines BLB0, BLB1, BLB2, . . . , and BLBn, the gates thereof are connected to the word lines WL1, WL3, WL5, . . . , and the sources thereof are connected to the cell plate potential lines VL to which the common cell plate potential Vcp is applied, through the capacitors C.

Each of the sense amplifiers 30-0, 30-1, . . . , and 30-n comprises P-channel type MOS-FETs Q1 and Q2 which are connected in series between the bit lines BL0 and BLB0, between the bit lines BL1 and BLB1, . . . , and between the bit lines BLn and BLBn and whose gates are connected to the bit lines BLB0, BLB1, . . . , BLBn and the bit lines BL0, BL1, . . . , and BLn, respectively; and N-channel type MOS-FETs Q3 and Q4 which are connected in series between the bit lines BL0 and BLB0, between the bit lines BL1 and BLB1, . . . , and between the bit lines BLn and BLBn and whose gates are connected to the bit lines BLB0, BLB1, . . . , BLBn and the bit lines BL0, BL1, . . . , and BLn, respectively. Each sense amplifier is configured so that a driving signal from a sense amplifier driver is supplied to the midpoint of connection between the P-channel type MOS-FETs Q1 and Q2 and the midpoint of connection between the N-channel type MOS-FETs Q3 and Q4.

Data read out from the memory cells 10-0, 10-1, . . . , and 10-m, each of which comprises a plurality of memory cells, are transmitted to a read DB (data bus) through the sense amplifiers 30-0, 30-1, . . . , and 30-n and read gates 40-0, 40-1, . . . , and 40-n. Data from a write DB (data bus) are transmitted to and written in the memory cells 10-0, 10-1, . . . , and 10-m through write gates 50-0, 50-1, . . . , and 50-n and the sense amplifiers 30-0, 30-1, . . . , and 30-n.

A D-RAM of the prior art shown in FIG. 3 comprises the D-RAM shown in FIG. 1, and additional read gates 41-0, 41-1, . . . , and 41-n which are provided for the sense amplifiers 30-0, 30-1, . . . , and 30-n, respectively. When a transfer gate 20 is on, data read out from the memory cells 10-0, 10-1, . . . , and 10-m, each of which comprises a plurality of memory cells, are transmitted to the read DB (data bus) through the sense amplifiers 30-0, 30-1, . . . , and 30-n, the transfer gate 20, D latches 60-0, 60-1, . . . , and 60-n and the read gates 41-0, 41-1, . . . , and 41-n. When the transfer gate 20 is off, the memory device shown in FIG. 3 operates in the same manner as the memory device shown in FIG. 1. The other configuration of the memory device is the same as that of the memory device shown in FIG. 1.

The D-RAM of the prior art shown in FIG. 3 has the following problem. Since data read out from the memory cells 10-0, 10-1, . . . , and 10-m pass through the sense amplifiers 30-0, 30-1, . . . , and 30-n when the data are transmitted to the D latches 60-0, 60-1, . . . , and 60-n, this makes it impossible to make access to the sense amplifiers 30-0, 30-1, . . . , and 30-n during the passage of the data, or the read data overwrite data of the sense amplifiers 30-0, 30-1, . . . , and 30-n.

The above-mentioned D-RAM has a problem of a long access time to a row line. This result from the fact that data of the memory cells of the D-RAM must be amplified and latched by the sense amplifiers before the data are read out. This is a fundamental problem of the D-RAM.

In order to solve the above-mentioned problems, a plurality of D-RAMs or a D-RAM having a bank structure is used so that the D-RAM operates using banks. More specifically, when access to a bank is being made, another bank is activated to previously enter a ready state so that data are read out consecutively. This is called interleaving. This allows apparently hiding the setup time (tRCD) and the reset time (tPR) required for the D-RAM.

It is possible that a plurality of D-RAMs or the D-RAM having the bank structure is used in order that the D-RAM having a conventional configuration may realize the operation using banks. When a plurality of D-RAMs is used, each D-RAM is not good in area efficiency, but each D-RAM is not limited in operation. On the other hand, the D-RAM having the bank structure is good in area efficiency because a part of a circuit is common among banks, whereas each bank is partly limited in operation.

The D-RAM has properties that its larger storage capacity yields its higher area efficiency, while its smaller storage capacity yields its lower area efficiency, similarly to other types of memories. A D-RAM having a multibank structure causes a reduction in area efficiency. Assume that a mixed D-RAM comprises banks of varying minimum units (i.e., blocks), e.g., a 2-Mbit block, a 1-Mbit block, and a 512-Kbit block. If a 4-Mbit D-RAM is manufactured without consideration of the bank structure, the decreasing order of area efficiency, from highest to lowest, is the 2-Mbit block, the 1-Mbit block, and the 512-Kbit block. When a 4-Mbit D-RAM is manufactured in consideration of the bank structure, the D-RAM can be, however, occupied by up to two banks each having the 2-Mbit block, up to four banks each having the 1-Mbit block, or up to eight banks each having the 512-Kbit block. Even if a D-RAM comprises two banks each having the 1-Mbit or 512-Kbit block, the area efficiency of the D-RAM is not different from that of a D-RAM comprising four banks each having the 1-Mbit block or eight banks each having the 512-Kbit block.

However, a D-RAM having a larger capacity than a necessary capacity, if a small-capacity D-RAM is used, must be used in order that the D-RAM may operate using banks. In terms of area efficiency, the reason is that the size of the block that is the minimum unit of the bank is large. For example, when a user wants to use a 1-Mbit D-RAM in the form of two banks, a D-RAM of at least 2 Mbits must be used to obtain a D-RAM having a two-bank structure, provided that one block equals 1 Mbit.

The above-mentioned D-RAM adopts a bank method in order to apparently hide the access time to a row line requiring consecutive data.

However, the bank method has to be provided with a D-RAM macro (which refers to a group of circuits having functions of a D-RAM), and therefore the method is often disadvantageous in area to an application that needs only a small capacity.

A RAM having a capacity of at least 2 Mbits or more must be packaged to employ a bank structure for, for example, an application that requires a RAM having a capacity of only 1 Mbit, if a macro size that can be provided is 1 Mbit and the use of a plural-bank structure is demanded.

The invention is designed to overcome the foregoing problems. It is an object of the invention to provide a memory device which can minimize a reduction in area efficiency even when the memory device has a small storage capacity and which can hide the access time to a row line.

SUMMARY OF THE INVENTION

According to a first aspect of the invention, there is provided a memory device which comprises: a matrix of a plurality of memory cells, each of which is connected to an intersection of each bit line of a plurality of pairs of bit lines and each word line of a plurality of word lines which intersect the bit lines; a plurality of sense amplifiers capable of read and write operations independently of one another, which are disconnectedly connected in parallel with the plurality of memory cells connected to the pairs of bit lines, through the pairs of bit lines; and a read gate and a write gate which are connected to each of the plurality of sense amplifiers connected in parallel with the pairs of bit lines, wherein the memory device is controlled so that read data is read out successively, when a word line to be activated, of the plurality of word lines is switched to another word line to be activated.

According to the first aspect of the invention, a plurality of memory cells is arranged in a matrix in such a manner that each memory cell is connected to an intersection of each bit line of a plurality of pairs of bit lines and each word line of a plurality of word lines which intersect the bit lines; a plurality of sense amplifiers capable of read and write operations independently of one another is disconnectedly connected in parallel with the plurality of memory cells connected to the pairs of bit lines, through the pairs of bit lines; a read gate and a write gate are connected to each of the plurality of sense amplifiers connected in parallel with the pairs of bit lines; and the memory device is controlled so that read data is read out successively, when a word line to be activated, of the plurality of word lines is switched to another word line to be activated.

According to a second aspect of the invention, there is provided the memory device of the first aspect which comprises a plurality of read gates and a plurality of write gates which are separately connected to each of the plurality of sense amplifiers connected in parallel with the pairs of bit lines.

According to a third aspect of the invention, there is provided the memory device of the first aspect which comprises a common read gate and a common write gate which are connected to each of the plurality of sense amplifiers connected in parallel with the pairs of bit lines.

According to fourth, fifth and sixth aspects of the invention, there are provided the memories of the first, second and third aspects, wherein each of the plurality of memory cells comprises a dynamic RAM.

DESCRIPTION OF THE PREFERRED EMBODIMENTS

Figure 1:
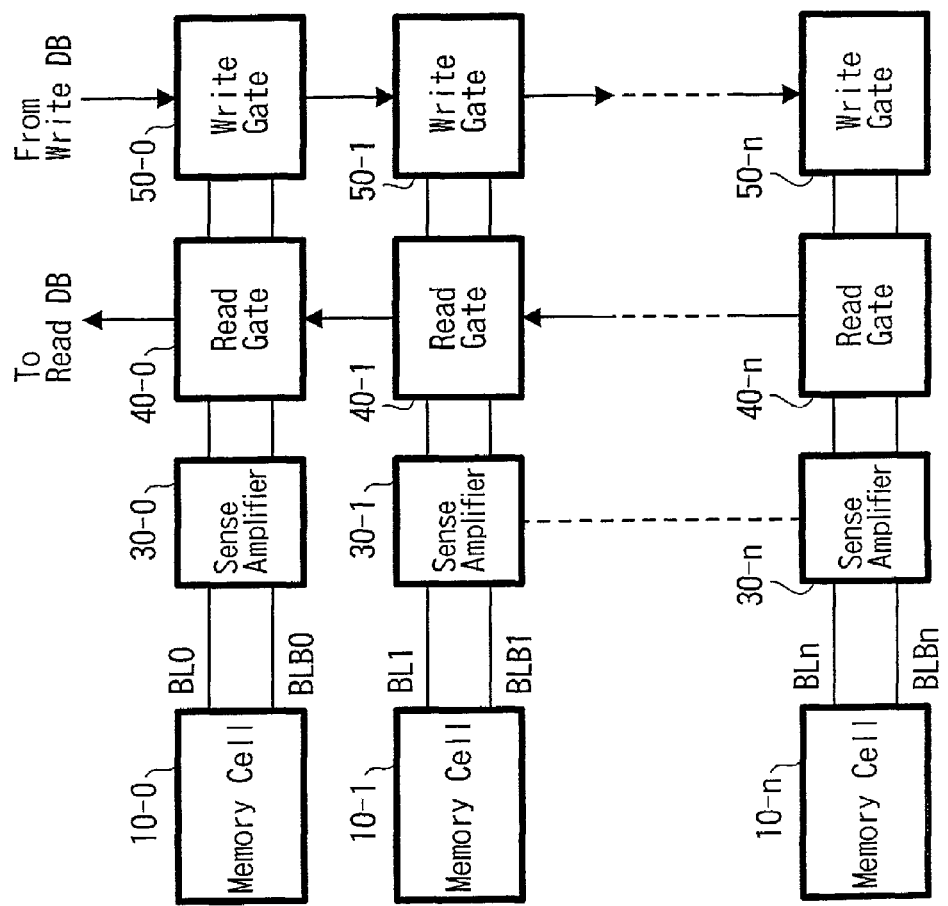
FIG. 1 is a block diagram showing a conventional D-RAM.
Figure 2:
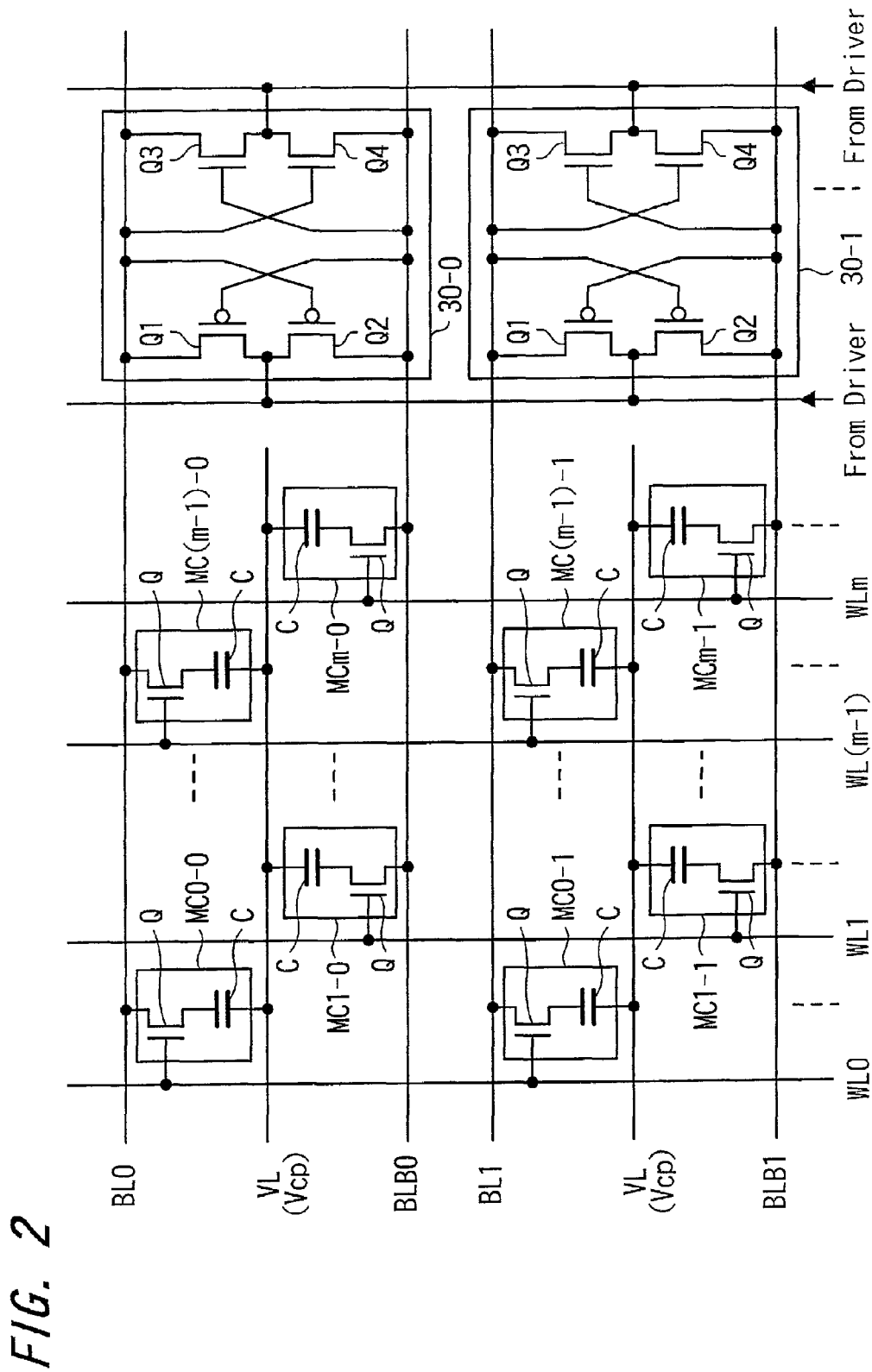
FIG. 2 is a circuit diagram specifically showing some of circuits shown in FIG. 1.

An example of a memory device (a D-RAM) according to an embodiment of the invention will be described below with reference to FIG. 4. Memory cells 10-0, 10-1, . . . , and 10-$n$ each comprise a plurality of memory cells, each of which is connected to an intersection of each bit line of a plurality of pairs of bit lines and each word line of a plurality of word lines, similarly to the memory cells described with reference to FIG. 2.

More specifically, the D-RAM has plural, (n+1) pairs of bit lines BL0 and BLB0, BL1 and BLB1, . . . , and BLn and BLBn; plural, (m+1) word lines WL0, WL1, . . . , and WLm which intersect the bit lines BL0 and BLB0, BL1 and BLB1, . . . , and BLn and BLBn; a matrix of a plurality of D-RAM memory cells 10-0 {MC0-0, MC1-0, MC2-0, . . . , MC(m−1)-0, and MCm−0}, 10-1 {MC0-1, MC1-1, MC2-1, . . . , MC(m−1)-1, and MCm−1}, . . . , and 10-$n$ {MC0-$n$, MC1-$n$, MC2-$n$, . . . , MC(m−1)-n, and MCm−n}, each of which is connected to an intersection of each bit line and each word line; and a plurality of sense amplifiers 30A-0, 30A-1, . . . , and 30A-n, and 30B-0, 30B-1, . . . , and 30B-n capable of read and write operations independently of one another, which are disconnectedly connected in parallel with the memory cells 10-0, 10-1, . . . , and 10-$n$, each of which comprises a plurality of memory cells, through the bit lines BL0 and BLB0, BL1 and BLB1, and BLn and BLBn, via transfer gates 20A and 20B which are turned on and off in accordance with gate signals TG0 and TG1, respectively.

The configuration of the sense amplifiers 30A-0, 30A-1, and 30A-n, and 30B-0, 30B-1, ..., and 30B-n is the same as that of the sense amplifiers described above with reference to FIG. 2.

Each of the memory cells 10-0 {MC0-0, MC1-0, MC2-0, MC(m−1)−0, and MCm−0}, 10-1 {MC0-1, MC1-1, MC2-1, ..., MC(m−1)−1, and MCm−1}, ..., and 10-n {MC0-n, MC1-n, MC2-n, ..., MC(m−1)−n, and MCm−n} comprises, for example, an N-channel (or P-channel) type MOS-FET Q which functions as a switching transistor, and a capacitor C connected in series with the MOS-FET Q.

The drains of the MOS-FETs Q of the memory cells MC0-0, MC2-0, MC4-0, ... of the memory cell 10-0, the memory cells MC0-1, MC2-1, MC4-1, ... of the memory cell 10-1, ..., and the memory cells MC0-n, MC2-n, MC4-n, ... of the memory cell 10-n are connected to the bit lines BL0, BL1, BL2, ..., and BLn, the gates thereof are connected to the word lines WL0, WL2, WL4, ..., and the sources thereof are connected to cell plate potential lines VL to which a common cell plate potential Vcp is applied, through the capacitors C.

The drains of the MOS-FETs Q of the memory cells MC1-0, MC3-0, MC5-0, ... of the memory cell 10-0, the memory cells MC1-1, MC3-1, MC5-1, ... of the memory cell 10-1, ..., and the memory cells MC1-n, MC3-n, MC5-n, ... of the memory cell 10-n are connected to the bit lines BLB0, BLB1, BLB2, ..., and BLBn, the gates thereof are connected to the word lines WL1, WL3, WL5, ..., and the sources thereof are connected to the cell plate potential lines VL to which the common cell plate potential Vcp is applied, through the capacitors C.

Read gates 40A-0, 40A-1, ..., and 40A-n and write gates 50A-0, 50A-1, ..., and 50A-n are connected to the sense amplifiers 30A-0, 30A-1, ..., and 30A-n, respectively.

Read gates 40B-0, 40B-1, ..., and 40B-n and write gates 50B-0, 50B-1, ..., and 50B-n are connected to the sense amplifiers 30B-0, 30B-1, ..., and 30B-n, respectively.

Data read out from the memory cells 10-0, 10-1, ..., and 10-n are transmitted to a read DB (data bus) through the transfer gate 20A which is turned on in accordance with the gate control signal TG0, the sense amplifiers 30A-0, 30A-1, ..., and 30A-n and the read gates 40A-0, 40A-1, ..., and 40A-n, or through the transfer gate 20B which is turned on in accordance with the gate control signal TG1, the sense amplifiers 30B-0, 30B-1, ..., and 30B-n and the read gates 40B-0, 40B-1, ..., and 40B-n.

Data from a write DB (data bus) are transmitted to and written in the memory cells 10-0, 10-1, ..., and 10-n through the write gates 50A-0, 50A-1, ..., and 50A-n, the sense amplifiers 30A-0, 30A-1, ..., and 30A-n and the transfer gate 20A turned on in accordance with the gate control signal TG0, or through the write gates 50B-0, 50B-1, ..., and 50B-n, the sense amplifiers 30B-0, 30B-1, ..., and 30B-n and the transfer gate 20B turned on in accordance with the gate control signal TG1.

Figure 3:
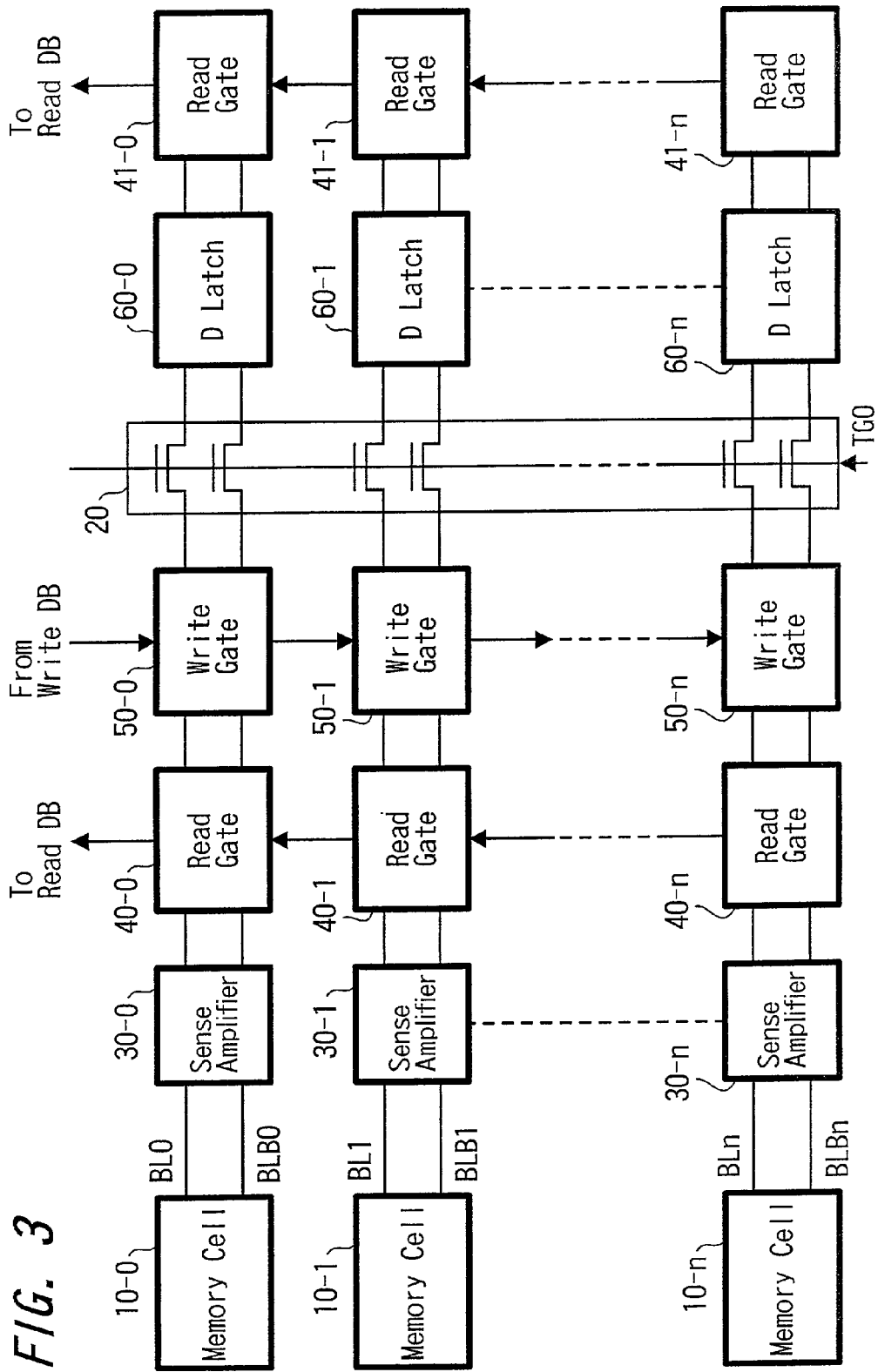
FIG. 3 is a block diagram showing another conventional D-RAM.

Next, the operation of the memory device shown in FIG. 4 will be described with reference to a timing chart shown in FIG. 5. In FIG. 5, CLK represents a clock waveform. Command represents a command from a microcomputer (not shown) which controls the memory device shown in FIG. 3. Address represents row and column address signals from the microcomputer. WL0 and WL1 represent the respective high and low voltages of the word lines WL0 and WL1, respectively. SA0-0, SA0-1, ..., and SA0-n represent the respective voltages of the sense amplifiers 30A-0, 30A-1, ..., and 30A-n on the pairs of bit lines BL0 and BLB0, BL1 and BLB1, ..., and BLn and BLBn, respectively. SA1-0, SA1-1, ..., and SA1-n represent the respective voltages of the sense amplifiers 30B-0, 30B-1, ..., and 30B-n on the pairs of bit lines BL0 and BLB0, BL1 and BLB1, ..., and BLn and BLBn, respectively.

Data Out represents output data outputted to the read data bus through the read gates. Data In represents input data supplied from the write data bus to the write gates. TGSel represents a gate select signal indicative of either the transfer gate 20A or 20B, from the microcomputer. TG0 and TG1 represent the control signals supplied to the transfer gates 20A and 20B, respectively.

The command Command first indicates ACT to a row address RA0 so as to activate the row address RA0, thus the word line WL0 first changes from low level to high level, and thus the command Command changes to Read so as to read column addresses CA00 and CA01. After that, the gate select signal TGSel changes to TG0 so as to change the gate signal TG0 from low level to high level, and thus the transfer gate 20A is turned on so as to allow the sense amplifiers 30A-0 and 30A-1 to amplify and latch "1" data of the memory cells 10-0 and 10-1, respectively. Then, the sense amplifiers 30A-0 and 30A-1 output the amplified data as output data Q00 and Q01 to the read data bus through the read gates 40A-0 and 40A-1, respectively.

The command Command then indicates ACT so as to activate a row address RA1, and thus the word line WL1 first changes from low level to high level so as to read out data of the memory cells. Then, the data are amplified, and thereafter the command Command changes to Read so as to read column addresses CA10 and CA11. After that, the gate select signal TGSel changes to TG1 so as to change the gate signal TG1 from low level to high level, and thus the transfer gate 20B is turned on so as to allow the sense amplifiers 30B-0 and 30B-1 to amplify and latch "1" data of the memory cells 10-0 and 10-1, respectively. Then, the sense amplifiers 30B-0 and 30B-1 output the amplified data as output data Q10 and Q11 to the read data bus through the read gates 40B-0 and 40B-1, respectively.

The command Command changes to Write, thus the column addresses CA00 and CA01 are read, and data D00 and D01 from the write data bus are written in and inverted, amplified and latched by the sense amplifiers 30A-0 and 30A-1 through the write gates 50A-0 and 50A-1, respectively. After that, the gate select signal TGSel changes to TG0 so as to change the gate signal TG0 from low level to high level, and thus the transfer gate 20A is turned on so as to allow the memory cells 10-0 and 10-1 to store the data of the sense amplifiers 30A-0 and 30A-1, respectively.

In a state in which the command Command remains Write, the column addresses CA10 and CA11 are read, and data D10 and D11 from the write data bus are written in and inverted, amplified and latched by the sense amplifiers 30B-0 and 30B-1 through the write gates 50B-0 and 50B-1, respectively. After that, the gate select signal TGSel changes to TG1 so as to change the gate signal TG1 from low level to high level, and thus the transfer gate 20B is turned on so as to allow the memory cells 10-0 and 10-1 to store the data of the sense amplifiers 30B-0 and 30B-1, respectively.

After that, the command Command changes to PRE (precharge) so as to precharge the bit lines BL1 and BLB1 of the row address RA1, and thus an equal constant voltage is applied to the bit lines BL1 and BLB1.

Figure 6:
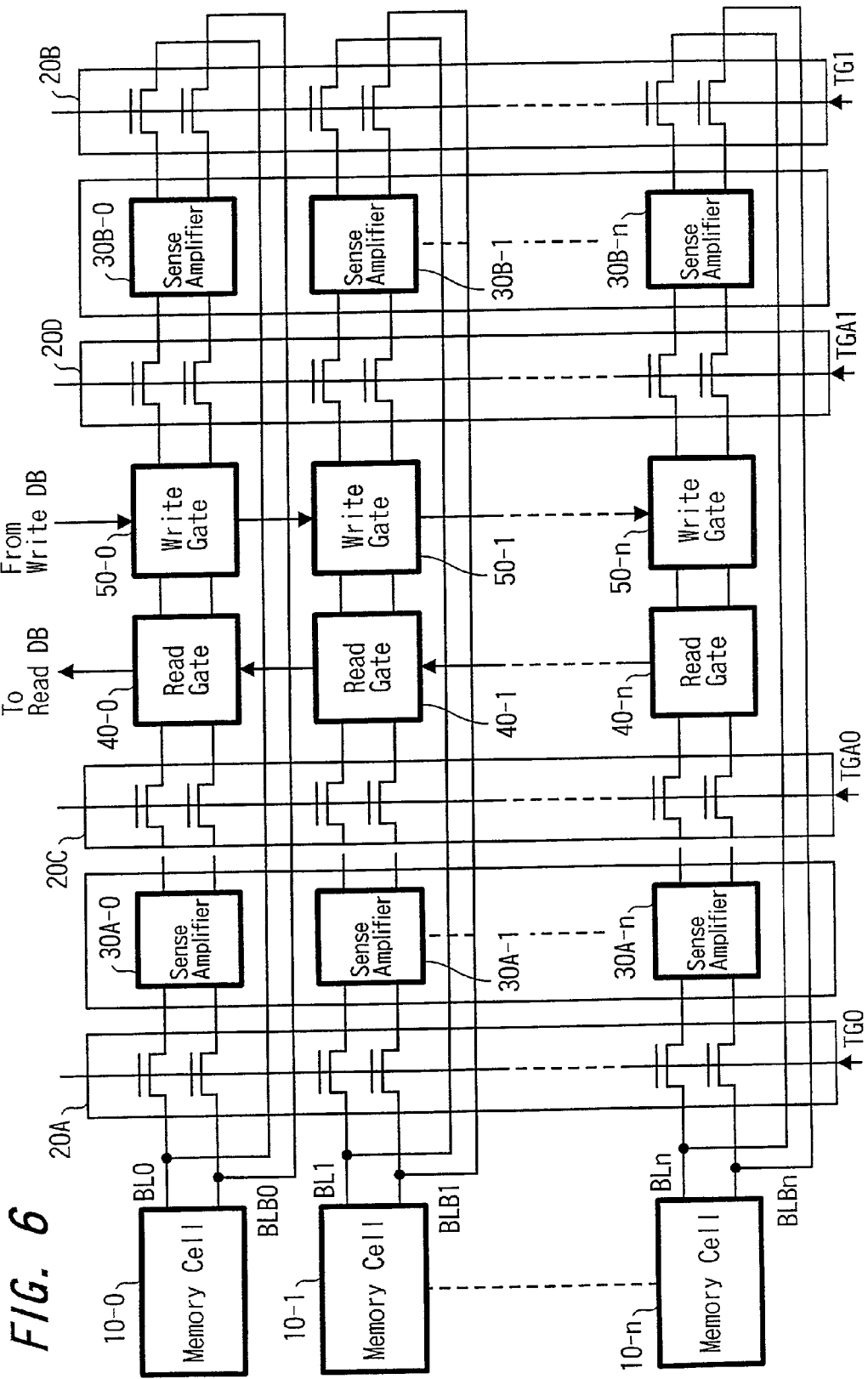
FIG. 6 is a block diagram showing another example of the memory device according to the embodiment of the invention.

Another example of the memory device according to the embodiment of the invention will be described below with reference to FIG. 6. In FIG. 6, the parts corresponding to the parts shown in FIG. 4 are indicated by the same reference numerals and characters, and the description of these parts is omitted to avoid repetition. Similarly to the memory device shown in FIG. 4, the memory device shown in FIG. 6 has plural, (n+1) pairs of bit lines BL0 and BLB0, BL1 and BLB1, . . . , and BLn and BLBn; plural, (m+1) word lines WL0, WL1, . . . , and WLm which intersect the bit lines BL0 and BLB0, BL1 and BLB1, . . . , and BLn and BLBn; a matrix of a plurality of D-RAM memory cells 10-0 {MC0-0, MC1-0, MC2-0, . . . , MC(m−1)−0, and MCm−0}, 10-1 {MC0-1, MC1-1, MC2-1, . . . , MC(m−1)−1, and MCm−1}, . . . , and 10-n {MC0-n, MC1-n, MC2-n, . . . , MC(m−1)−n, and MCm−n}, each of which is connected to an intersection of each bit line and each word line; and a plurality of sense amplifiers 30A-0, 30A-1, . . . , and 30A-n, and 30B-0, 30B-1, . . . , and 30B-n capable of read and write operations independently of one another, which are disconnectedly connected in parallel with the memory cells 10-0, 10-1, . . . , and 10-n, each of which comprises a plurality of memory cells, through the bit lines BL0 and BLB0, BL1 and BLB1, . . . , and BLn and BLBn, via transfer gates 20A and 20B which are turned on and off in accordance with gate signals TG0 and TG1, respectively.

In this example, common read gates 40-0, 40-1, . . . , and 40-n and common write gates 50-0, 50-1, . . . , and 50-n are connected in parallel with the sense amplifiers 30A-0 and 30B-0, 30A-1 and 30B-1, . . . , and 30A-n and 30B-n through transfer gates 20C and 20D which are turned on and off in accordance with gate signals TGA0 and TGA1, respectively. The other configuration of the memory device shown in FIG. 6 is the same as that of the memory device shown in FIG. 4.

Figure 7:
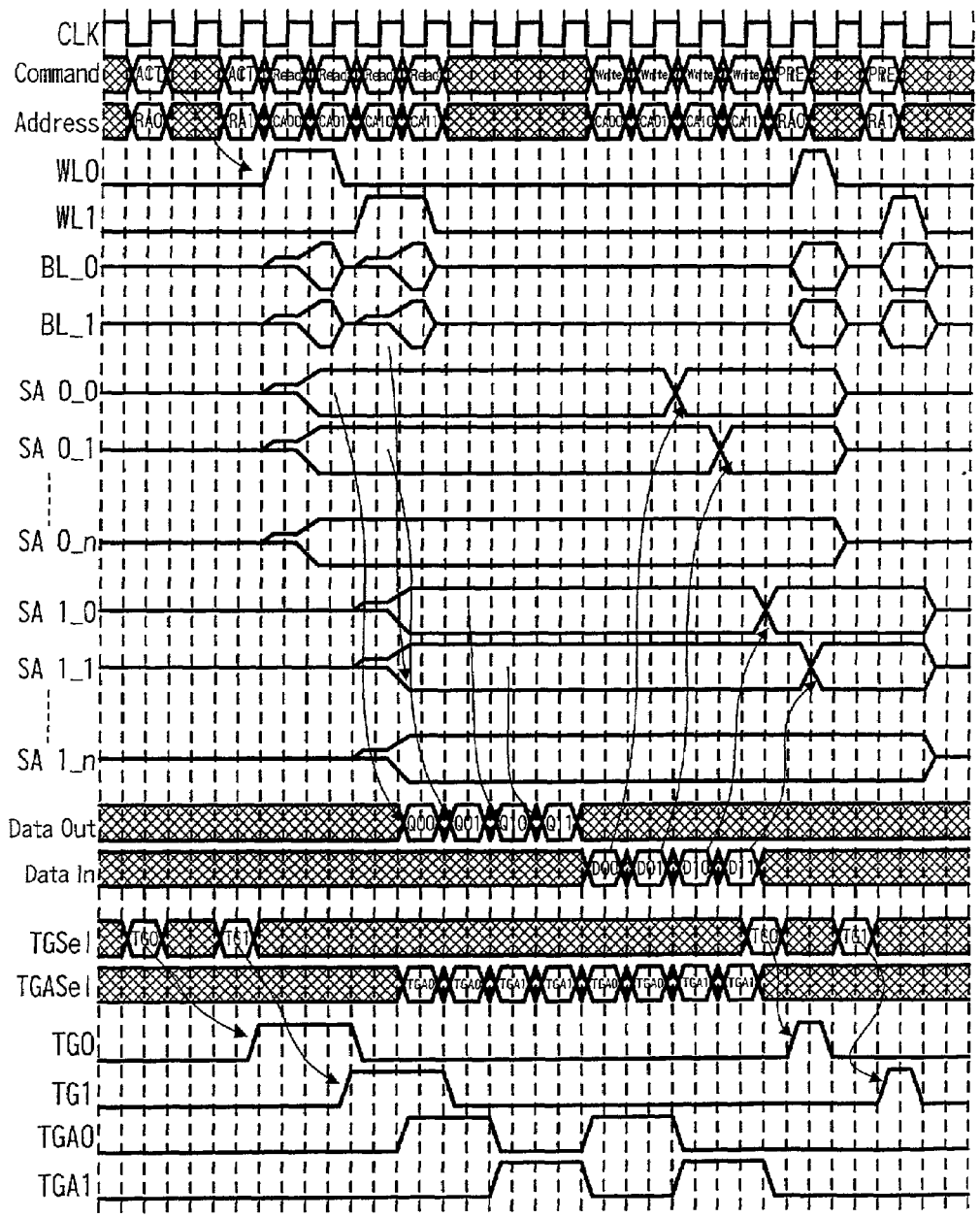
FIG. 7 is a timing chart showing waveforms for use in the description of operation of the memory device shown in FIG. 6.

Next, the operation of the memory device shown in FIG. 6 will be described with reference to a timing chart shown in FIG. 7. In FIG. 7, the parts corresponding to the parts shown in FIG. 5 are indicated by the same reference numerals and characters, and thus the description of these parts is omitted to avoid repetition. TGASel represents a gate select signal indicative of either the transfer gate 20C or 20D.

The command Command first indicates ACT so as to activate a row address RA0, thus the word line WL0 first changes from low level to high level, thus the command Command changes to Read, and thus the gate select signal TGSel changes to TG0 so as to read column addresses CA00 and CA01. After that, the gate signal TG0 changes from low level to high level, and thus the transfer gate 20A is turned on so as to allow the sense amplifiers 30A-0 and 30A-1 to amplify and latch "1" data of the memory cells 10-0 and 10-1, respectively. Thereafter, the gate select signal TGASel changes to TGA0 so as to change the gate signal TGA0 from low level to high level, and thus the transfer gate 20C is turned on. Then, the sense amplifiers 30A-0 and 30A-1 output the amplified data as output data Q00 and Q01 to the read data bus through the read gates 40-0 and 40-1, respectively.

The command Command then indicates ACT so as to activate a row address RA1, thus the word line WL1 first changes from low level to high level, thus the command Command changes to Read, and thus the gate select signal TGSel changes to TG1 so as to read column addresses CA10 and CA11. After that, the gate signal TG1 changes from low level to high level, and thus the transfer gate 20B is turned on so as to allow the sense amplifiers 30B-0 and 30B-1 to amplify and latch "1" data of the memory cells 10-0 and 10-1, respectively. Thereafter, the gate select signal TGASel changes to TGA1 so as to change the gate signal TGA1 from low level to high level, and thus the transfer gate 20D is turned on. Then, the sense amplifiers 30B-0 and 30B-1 output the amplified data as output data Q10 and Q11 to the read data bus through the read gates 40-0 and 40-1, respectively.

The command Command changes to Write, and thus the column addresses CA00 and CA01 are read. The gate select signal TGASel first indicates TGA0 so as to change the gate signal TGA0 from low level to high level, and thus the transfer gate 20C is turned on. Data D00 and D01 from the write data bus are written in and inverted, amplified and latched by the sense amplifiers 30A-0 and 30A-1 through the write gates 50-0 and 50-1, respectively. After that, the gate select signal TGSel changes to TG0 so as to change the gate signal TG0 from low level to high level, and thus the transfer gate 20A is turned on so as to allow the memory cells 10-0 and 10-1 to store the data of the sense amplifiers 30A-0 and 30A-1, respectively.

In a state in which the command Command remains Write, the column addresses CA10 and CA11 are read. The gate select signal TGASel first indicates TGA1 so as to change the gate signal TGA1 from low level to high level, and thus the transfer gate 20D is turned on. Data D10 and D11 from the write data bus are written in and inverted, amplified and latched by the sense amplifiers 30B-0 and 30B-1 through the write gates 50-0 and 50-1, respectively. After that, the gate select signal TGSel changes to TG1 so as to change the gate signal TG1 from low level to high level, and thus the transfer gate 20B is turned on so as to allow the memory cells 10-0 and 10-1 to store the data of the sense amplifiers 30B-0 and 30B-1, respectively.

After that, the command Command changes to PRE (precharge) so as to precharge the bit lines BL1 and BLB1 of the row address RA1, and thus an equal constant voltage is applied to the bit lines BL1 and BLB1.

Incidentally, a D-RAM is characterized by that the activation of an address of a row line allows a sense amplifier to read out a few thousands of bits of data, which is then selectively read out by controlling an address of a column line. Generally, the operation of activating the address of the row line so as to prepare data for the reading is very slow, which is a drawback of the D-RAM. The technique for eliminating the drawback is interleaving using a bank structure, which is described in the section "Description of the Related Art". More specifically, when data of a bank is being read out, data of another bank is prepared, and thus the latter data can be read out in succession to the former data immediately after the end of reading of the former data. However, the interleaving requires a plurality of banks, and therefore causes a reduction in area efficiency in the case of a small-capacity memory device.

Figure 4:
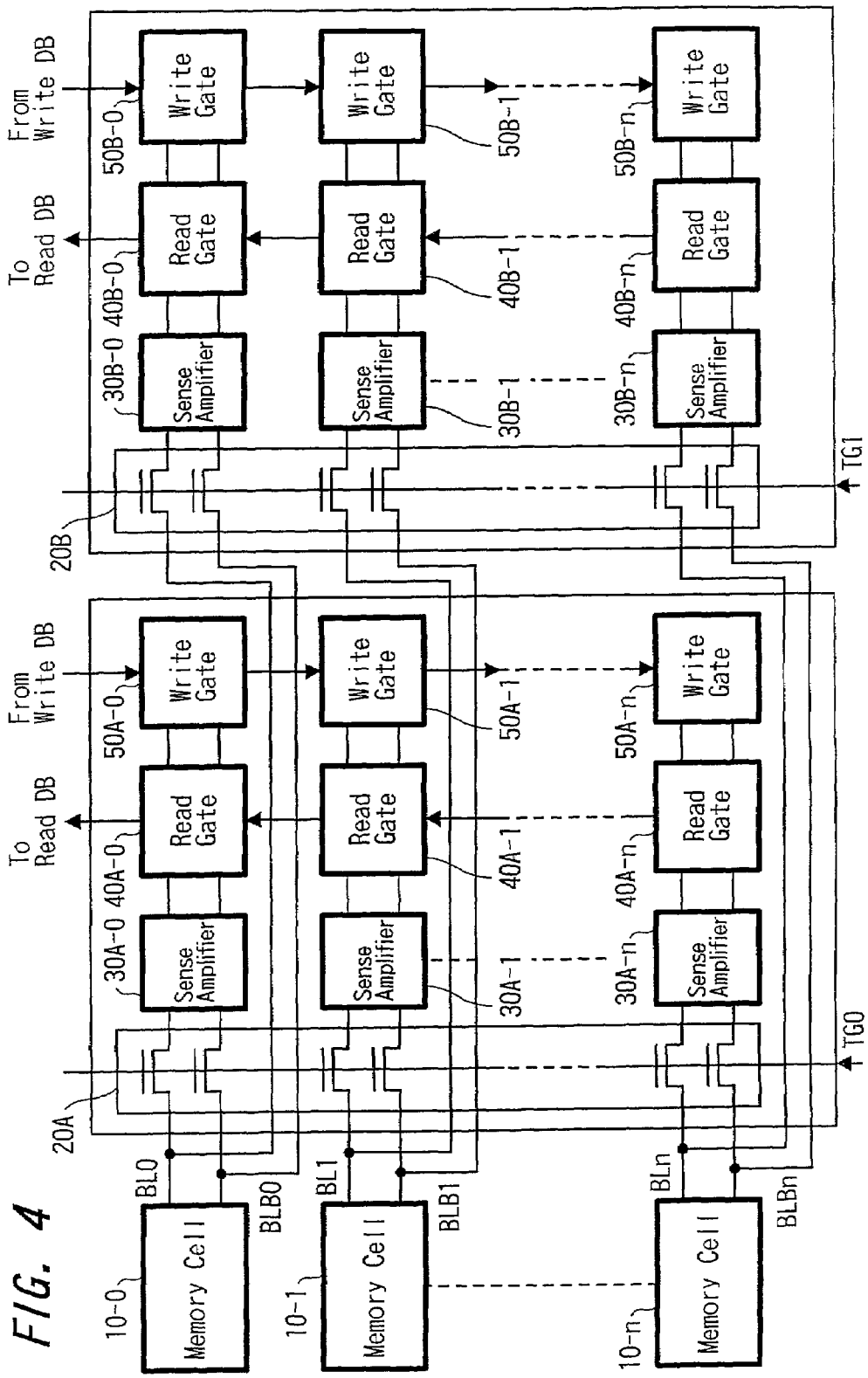
FIG. 4 is a block diagram showing an example of a memory device according to an embodiment of the invention.
Figure 5:
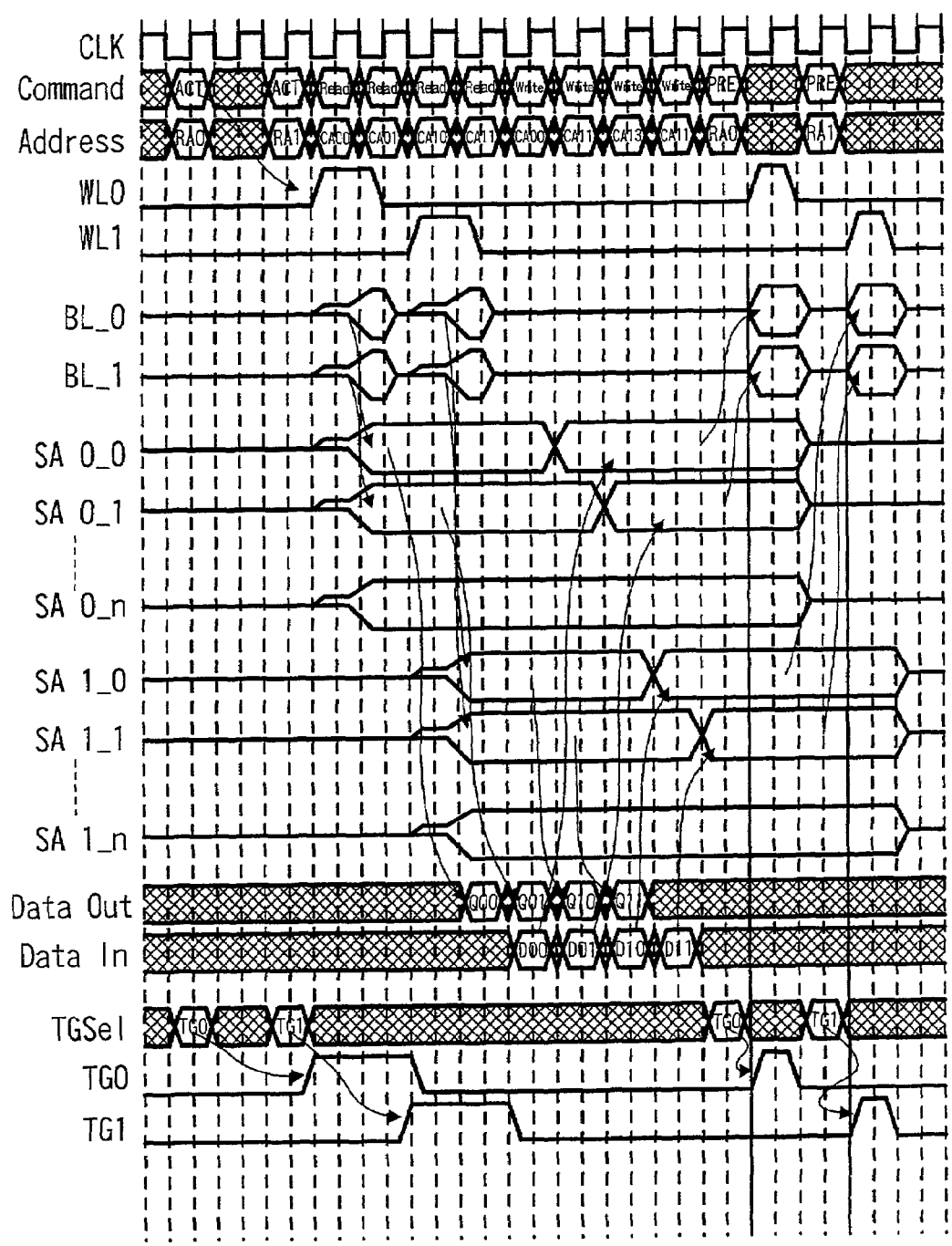
FIG. 5 is a timing chart showing waveforms for use in the description of operation of the memory device shown in FIG. 4.
Figure 8:
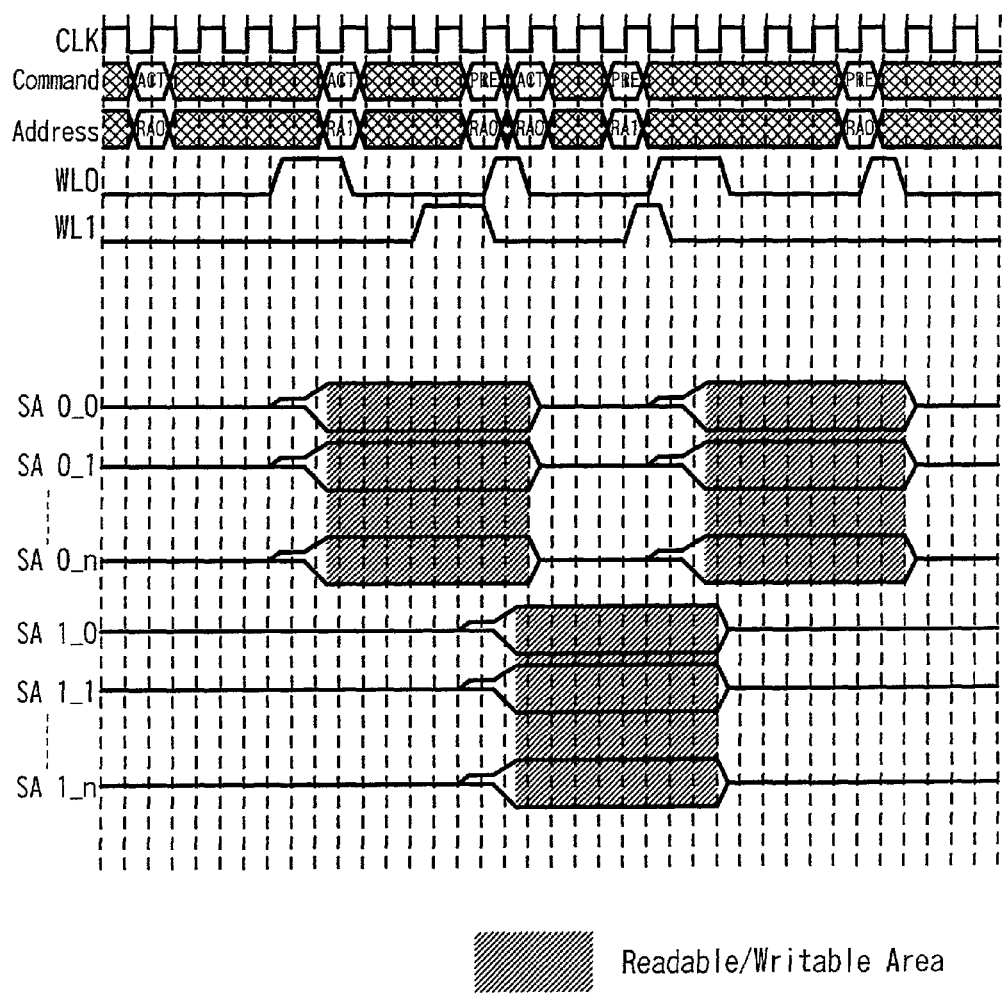
FIG. 8 is a timing chart showing waveforms for use in the description of operation of the memory devices shown in FIGS. 4 and 6.

However, the memories shown in FIGS. 4 and 6 are each provided with a plurality of sense amplifiers capable of read and write operations independently of one another, which are disconnectedly connected in parallel with a plurality of memory cells, each of which is connected to each of the pairs of bit lines, through the pairs of bit lines, and the memories are controlled so that read data may be read out successively, when a word line to be activated, of a plurality of word lines is switched to another word line to be activated. Therefore, the above-described memories can minimize a reduction in area efficiency even when the memories have a small capacity, and the memories also enable operation equivalent to the interleaving performed by a memory device having the bank structure (see FIG. 8). In FIG. 8, the parts corresponding to the parts shown in FIGS. 5 and 7 are indicated by the same reference numerals and characters, and thus the description of these parts is omitted to avoid repetition.

The memories shown in FIGS. 4 and 6 are each provided with a plurality of sense amplifiers capable of read and write operations independently of one another, which are disconnectedly connected in parallel with a plurality of memory cells, each of which is connected to each of the pairs of bit lines, through the pairs of bit lines; and read gates and write gates which are connected to a plurality of sense amplifiers connected to a plurality of memory cells. Therefore, when one sense amplifier is being used to write and read data in/from a memory cell, another sense amplifier can be used to sense a subsequent row address, so that an erroneous hit of a page can be prevented.

When one sense amplifier is being used to write and read data in/from a memory cell, another sense amplifier may be used as a static RAM (an S-RAM).

For example, when 2-Mbit blocks are used to manufacture a D-RAM having a storage capacity of 4 Mbits, the D-RAM has a structure of only up to two banks. Therefore, 1-Mbit or 512-Kbit blocks must be used in order that a D-RAM may comprise four banks. However, as described above, the adoption of a system comprising a plurality of sense amplifiers permits manufacturing a D-RAM having functions substantially equivalent to functions of a D-RAM comprising four banks using 2-Mbit blocks. Accordingly, although a larger number of additional sense amplifiers yield a lower area efficiency of a memory device, the memory device is greatly improved in area efficiency as compared to a memory device using 1-Mbit or 512-Kbit blocks.

According to a first aspect of the invention, a memory device comprises: a matrix of a plurality of memory cells, each of which is connected to an intersection of each bit line of a plurality of pairs of bit lines and each word line of a plurality of word lines which intersect the bit lines; a plurality of sense amplifiers capable of read and write operations independently of one another, which are disconnectedly connected in parallel with the plurality of memory cells connected to the pairs of bit lines, through the pairs of bit lines; and a read gate and a write gate which are connected to each of the plurality of sense amplifiers connected in parallel with the pairs of bit lines, wherein the memory device is controlled so that read data is read out successively, when a word line to be activated, of the plurality of word lines is switched to another word line to be activated. Therefore, the memory device can minimize a reduction in area efficiency even when the memory device has a small storage capacity, can realize operation equivalent to interleaving using the bank structure, can hide the access time to a row line, and can use as an S-RAM any one of the plurality of sense amplifiers connected in parallel with the pairs of bit lines.

According to a second aspect of the invention, the memory device of the first aspect comprises a plurality of read gates and a plurality of write gates which are separately connected to each of the plurality of sense amplifiers connected in parallel with the pairs of bit lines. Therefore, the memory device can minimize a reduction in area efficiency even when the memory device has a small storage capacity, can realize operation equivalent to interleaving using the bank structure, can hide the access time to a row line, and can use as an S-RAM any one of the plurality of sense amplifiers connected in parallel with the pairs of bit lines.

According to a third aspect of the invention, the memory device of the first aspect comprises a common read gate and a common write gate which are connected to each of the plurality of sense amplifiers connected in parallel with the pairs of bit lines. Therefore, the memory device can minimize a reduction in area efficiency even when the memory device has a small storage capacity, can realize operation equivalent to interleaving using the bank structure, can hide the access time to a row line, can use as an S-RAM any one of the plurality of sense amplifiers connected in parallel with the pairs of bit lines, and can have a smaller number of read gates and write gates connected to the plurality of sense amplifiers connected in parallel with the pairs of bit lines.

In the memories of the first, second and third aspects, each of the plurality of memory cells comprises a dynamic RAM.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A memory device comprising:
a matrix of a plurality of memory cells, each of which is connected to an intersection of each bit line of a plurality of pairs of bit lines and each word line of a plurality of word lines which intersect the bit lines;
a plurality of sense amplifiers capable of read and write operations independently of one another, which are disconnectedly connected in parallel with the plurality of memory cells connected to the pairs of bit lines through the pairs of bit lines; and
a read gate and a write gate which are connected to each of the plurality of sense amplifiers connected in parallel with the pairs of bit lines,
wherein the memory device is controlled so that read data is read out successively when another of the plurality of word lines is activated.

2. The memory device according to claim 1 comprising a plurality of read gates and a plurality of write gates which are separately connected to each of the plurality of sense amplifiers connected in parallel with the pairs of bit lines.

3. The memory device according to claim 2, wherein each of the plurality of memory cells comprises a dynamic RAM.

4. The memory device according to claim 1 comprising a common read gate and a common write gate which are connected to each of the plurality of sense amplifiers connected in parallel with the pairs of bit lines.

5. The memory device according to claim 4, wherein each of the plurality of memory cells comprises a dynamic RAM.

6. The memory device according to claim 1, wherein each of the plurality of memory cells comprises a dynamic RAM.

7. A memory device comprising:
a plurality of memory cells;
a plurality of sense amplifiers;
a plurality of read gates communicating with a read bus;
a plurality of write gates communicating with a write bus;
wherein each of the memory cells connects to the read bus through a read gate and a first sense amplifier that are positioned in series;
wherein each of the memory cells connects to the read bus through a read gate and a second sense amplifier that are positioned in series;
wherein each of the memory cells connects to the write bus through a write gate and the first sense amplifier that are positioned in series;
wherein each of the memory cells connects to the write bus through a write gate and the second sense amplifier that are positioned in series; and
wherein the first sense amplifier and the second sense amplifier are positioned in parallel, whereby data is able to be transferred through both parallel sense amplifiers during read and write operations.

8. The memory device according to claim 7, wherein the read gate in series with the first sense amplifier is a same read gate as the read gate positioned in series with the second sense amplifier.

9. The memory device according to claim 7, wherein the write gate in series with the first sense amplifier is a same write gate as the write gate positioned in series with the second sense amplifier.

10. The memory device according to claim 7, wherein the read gate in series with the first sense amplifier is a different read gate from the read gate positioned in series with the second sense amplifier.

11. The memory device according to claim 7, wherein the write gate in series with the first sense amplifier is a different write gate from the write gate positioned in series with the second sense amplifier.

12. The memory device according to claim 7, further comprising a switch positioned between the first sense amplifier and the memory cell, wherein closing the switch allows data to be transferred between the memory cell and the sense amplifier.

13. The memory device according to claim 12, further comprising a second switch positioned between the second sense amplifier and the memory cell, wherein closing the second switch allows data to be transferred between the memory cell and the second sense amplifier.

* * * * *